(12) United States Patent
Tsironis

(10) Patent No.: US 10,276,910 B1
(45) Date of Patent: *Apr. 30, 2019

(54) PROGRAMMABLE HARMONIC AMPLITUDE AND PHASE CONTROLLER

(71) Applicant: Christos Tsironis, Dollard-des-Ormeaux (CA)

(72) Inventor: Christos Tsironis, Kirkland (CA)

(*) Notice: Subject to any disclaimer, the term of this patent is extended or adjusted under 35 U.S.C. 154(b) by 0 days.

This patent is subject to a terminal disclaimer.

(21) Appl. No.: 15/610,018

(22) Filed: May 31, 2017

Related U.S. Application Data

(60) Provisional application No. 62/343,318, filed on May 31, 2016.

(51) Int. Cl.
| H01P 1/22 | (2006.01) |
| H01P 5/18 | (2006.01) |
| H03H 7/40 | (2006.01) |
| H01P 1/18 | (2006.01) |

(52) U.S. Cl.
CPC ............. *H01P 5/183* (2013.01); *H01P 1/182* (2013.01); *H01P 1/222* (2013.01); *H03H 7/40* (2013.01)

(58) Field of Classification Search
CPC ........... H01P 1/182; H01P 1/222; H03H 7/38; H03H 7/40
USPC ............................ 333/17.3, 17.2, 32, 33, 263
See application file for complete search history.

(56) References Cited

U.S. PATENT DOCUMENTS

| 7,282,926 | B1 | 10/2007 | Verspecht et al. | |
| 7,595,709 | B1 * | 9/2009 | Boulerne | G01R 31/2601 324/642 |
| 8,188,816 | B1 * | 5/2012 | Tsironis | H01P 5/04 333/17.3 |
| 9,252,471 | B1 | 2/2016 | Tsironis | |
| 9,960,472 | B1 * | 5/2018 | Tsironis | H01P 5/04 |

OTHER PUBLICATIONS

"Load pull characterization system for differential devices", [online], Conference 2003, Fall 2003, 62nd ARFTG IEEE Microwave Measurement [Retrieved on May 18, 2017]. Retrieved from Internet <URL: http://ieeexplore.ieee.org/document/1459774>.

Dual Directional Couplers, Model IPP-3515 Datasheet, [online], Innovative Power Products, [Retrieved on May 18, 2017]. Retrieved from Internet <URL: http://innovativepp.com/product/ipp-3151/>.

(Continued)

*Primary Examiner* — Stephen E. Jones

(57) ABSTRACT

A continuously adjustable programmable harmonic microwave attenuator and linear phase controller (HAPC) uses mobile signal couplers (wave-probes) in a slabline structure which is terminated with 50 Ohms. The coupled ports of the wave-probes are connected with the output port of the unit via a power combiner using flexible RF cables. The wave-probes are attached to the vertical axes of mobile carriages, which are placed at variable distances from the input port, corresponding to the expected transmission phases, whereas the depth, at which the wave-probes are inserted into the slabline, determines the coupling factors and thus the value of the attenuation. The unit can be calibrated at a number of harmonic frequencies typically equal to the number of the wave-probes used.

11 Claims, 14 Drawing Sheets

(56) References Cited

OTHER PUBLICATIONS

"An Introduction to Multiport and Balanced Device Measurements" Application Note 1373-1, [online], Keysight Technologies, [Retrieved on May 30, 2017]. Retrieved from Internet <URL: http://www.keysight.com/main/facet.jspx?&cc=CA&lc=eng&k= application+note+1373-2&pSearch=tnmSearch&hasLuckySearch=true>.
Balun, [online], Wikipedia, [Retrieved on May 17, 2017]. Retrieved from Internet <URL: http://en.wikipedia.org/wiki/Balun>.
Variable Attenuators, [online], Microwaves 101, [Retrieved on May 17, 2017]. Retrieved from Internet <URL: http://www.microwaves101.com/encyclopedia/attenuatorvariable.cfm>.
Phase shifters, [online], Microwaves 101, [Retrieved on May 17, 2017]. Retrieved from Internet <URL: http://www.microwaves101.com/encyclopedia/phaseshifters.cfm>.
Waveguide Variable Attenuator, product catalog p. 14, [online], Elmika [Retrieved on May 30, 2017]. Retrieved from Internet <URL: http://www.elmika.com/catalogs.html>.
Manual Step Attenuator, [online], Keysight Technologies [Retrieved on May 30, 2017]. Retrieved from Internet <URL: http://www.keysight.com/en/pd-1000001981%3Aepsg%3Apro-pn-8496A/manual-attenuator-4-ghz-110-db-10-db-steps?nid=-32728.536879121&cc=CA&lc=eng>.
"Computer Controlled Microwave Tuner, CCMT", Product Note 41, Focus Microwaves Inc. 1998, pp. 2-4.
Trombone Line Stretchers, ST series, Datasheet, [online] Microlab, [Retrieved on May 30, 2017]. Retrieved from Internet <URL: https://microlabtech.com/st-15n.html >.

* cited by examiner

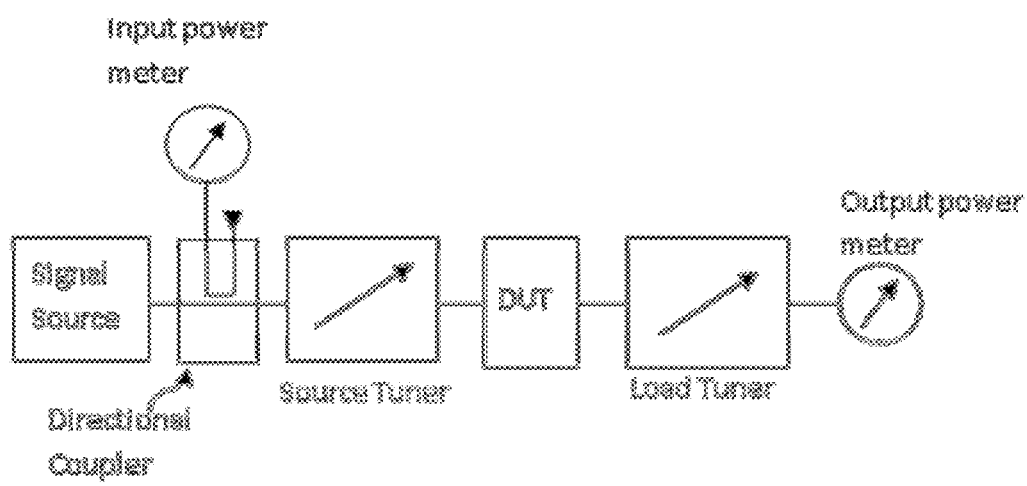
FIG. 1: Prior art

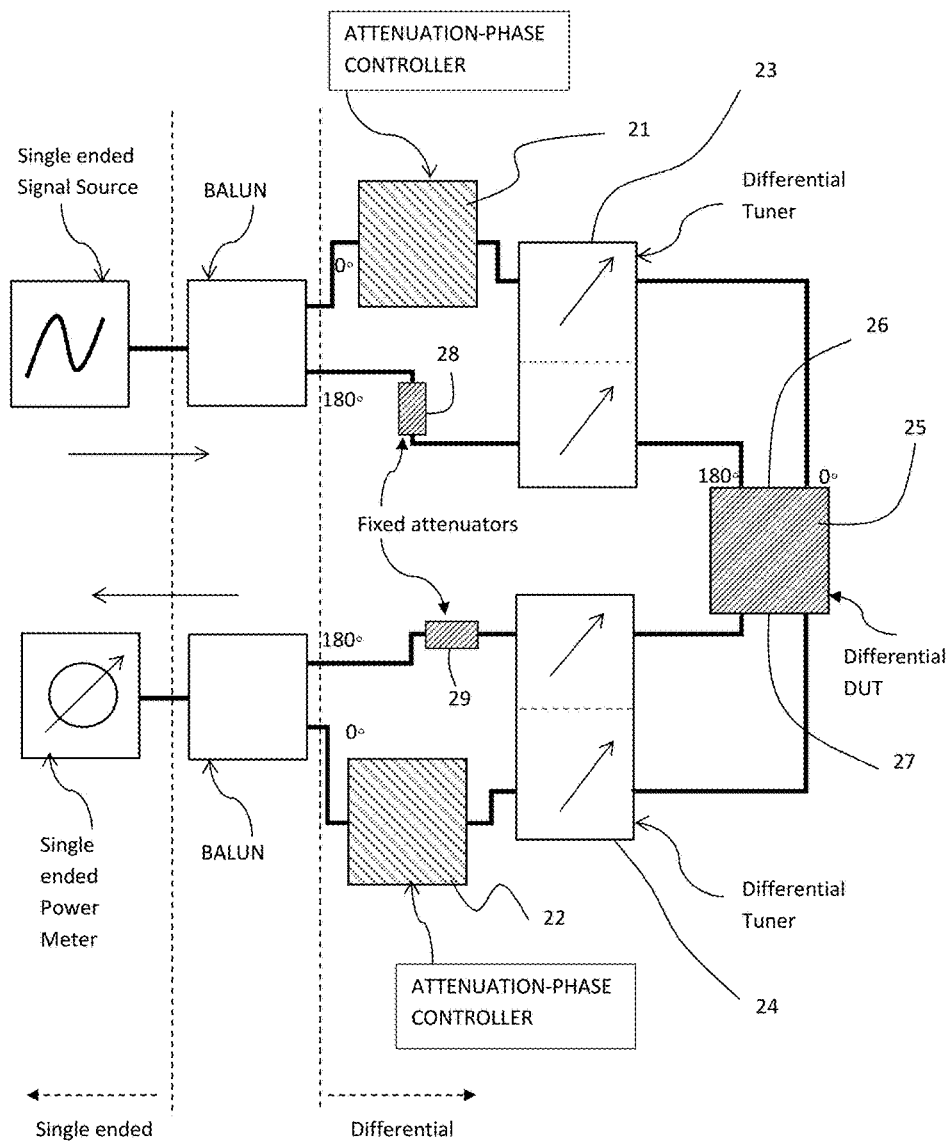
FIG. 2: Prior art

FIG. 3A: Prior art
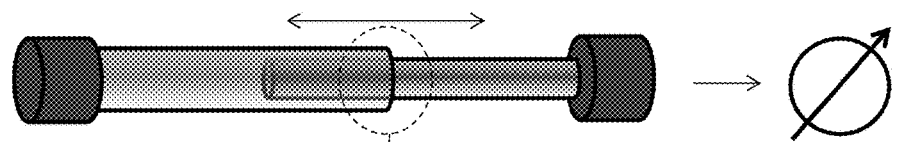
FIG. 3B: Prior art
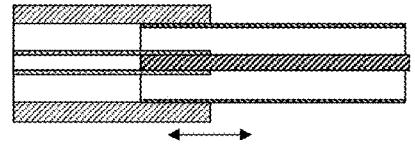
FIG. 3C: Prior art
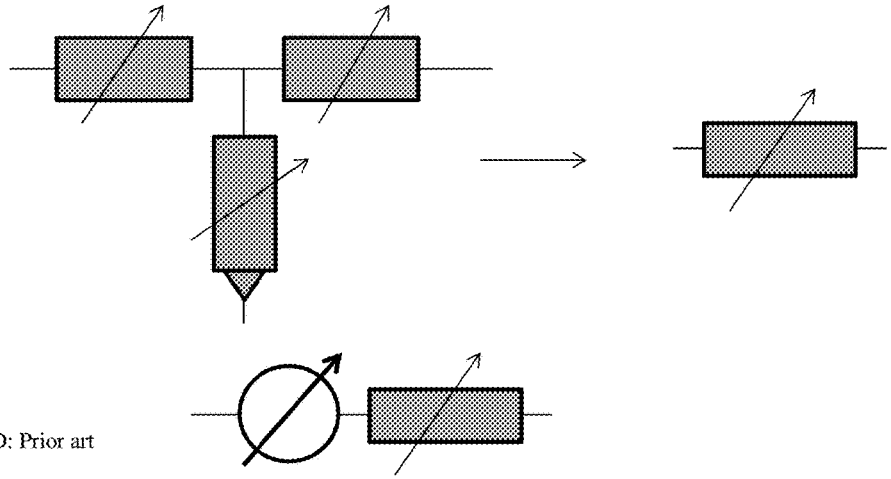
FIG. 3D: Prior art FIG. 4A: Prior art
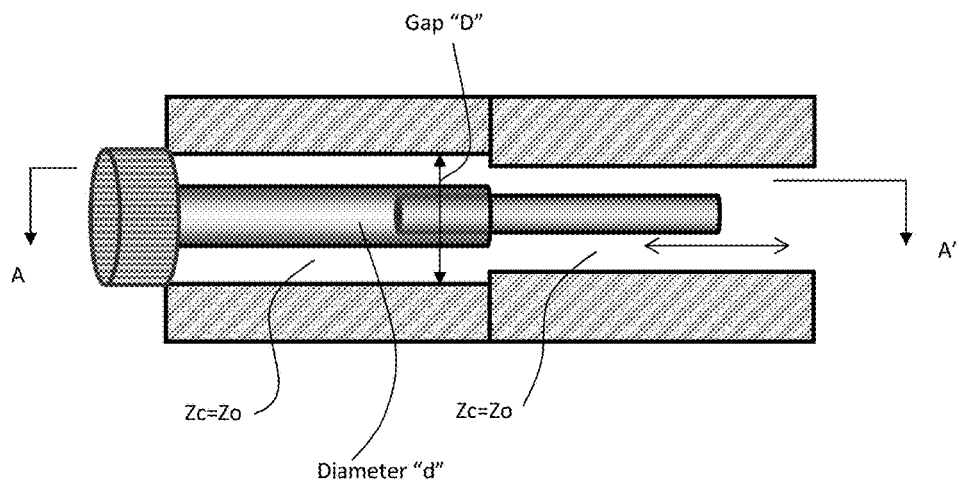
FIG. 4B: Prior art
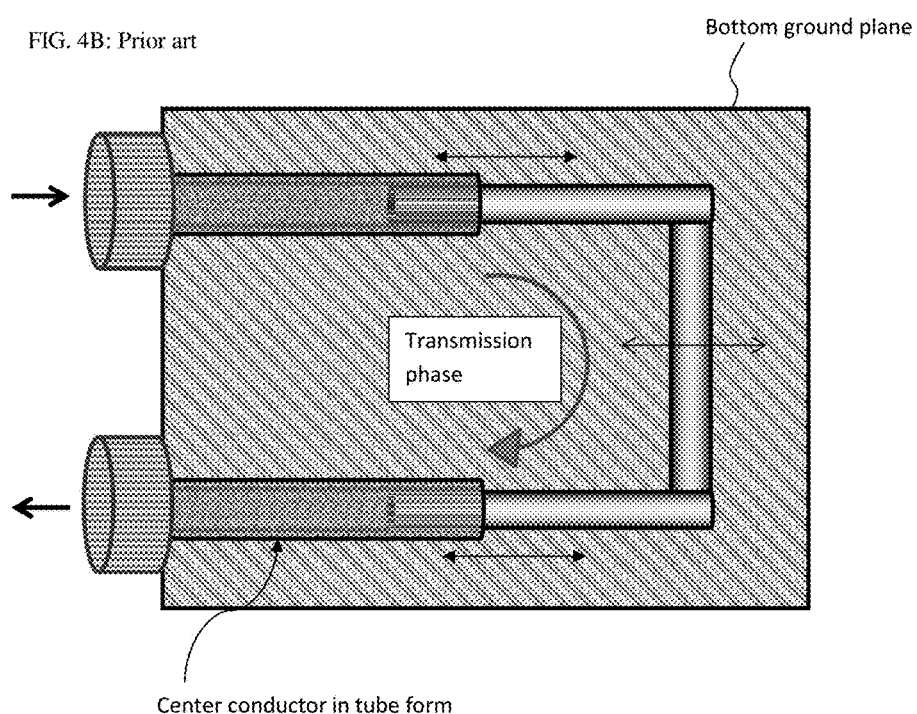

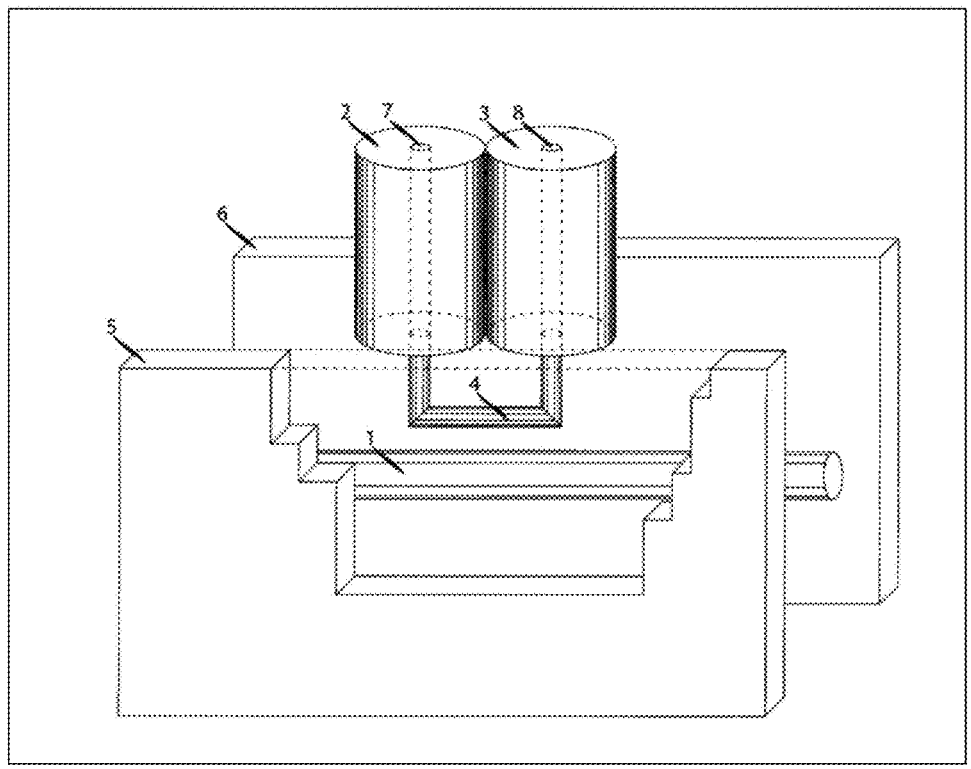
FIG. 5: Prior art

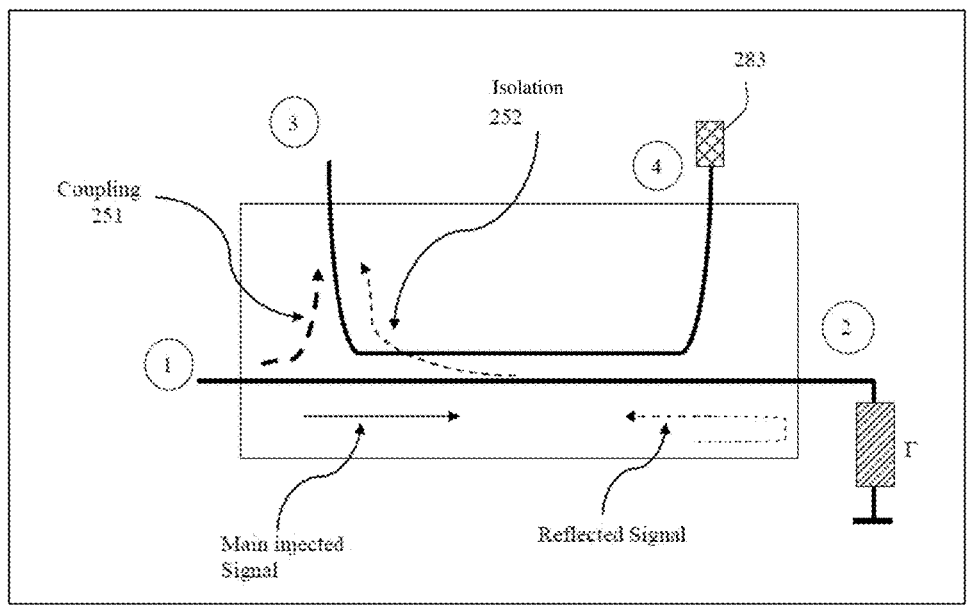
FIG. 6: Prior art

PROGRAMMABLE HARMONIC AMPLITUDE AND PHASE CONTROLLER

PRIORITY CLAIM

This application claims priority on Provisional Application 62/343,318, filed on May 31, 2016, titled "Programmable Harmonic Amplitude and Phase Controller".

CROSS-REFERENCE TO RELATED ARTICLES

1. "Load pull characterization system for differential devices", [online], Conference 2003, Fall 2003, 62$^{nd}$ ARFTG IEEE Microwave Measurement [Retrieved on 2017 May 18]. Retrieved from Internet <URL: http://ieeexplore.ieee.org/document/1459774>
2. Dual Directional Couplers, Model IPP-3515 Datasheet, [online], Innovative Power Products, [Retrieved on 2017 May 18]. Retrieved from Internet <URL: http://innovativepp.com/product/ipp-3151/>
3. "An Introduction to Multiport and Balanced Device Measurements" Application Note 1373-1, [online], Keysight Technologies, [Retrieved on 2017 May 30]. Retrieved from Internet <URL: http://www.keysight.com/main/facet.jspx?&cc=CA&lc=eng&k=application+note+1373-2&pSearch=tnmSearch&hasLuckySearch=true>
4. Balun, [online], Wikipedia, [Retrieved on 2017 May 17]. Retrieved from Internet <URL: http://en.wikipedia.org/wiki/Balun>
5. Variable Attenuators, [online], Microwaves 101, [Retrieved on 2017 May 17]. Retrieved from Internet <URL: http://www.microwaves101.com/encyclopedia/attenuatorvariable.cfm>
6. Phase shifters, [online], Microwaves 101, [Retrieved on 2017 May 17]. Retrieved from Internet <URL: http://www.microwaves101.com/encyclopedia/phaseshifters.cfm>
7. Waveguide Variable Attenuator, product catalog page 14, [online], Elmika [Retrieved on 2017 May 30]. Retrieved from Internet <URL: http://www.elmika.com/catalogs.html>
8. Manual Step Attenuator, [online], Keysight Technologies [Retrieved on 2017 May 30]. Retrieved from Internet <URL: http://www.keysight.com/en/pd-1000001981%3Aepsg%3Apro-pn-8496A/manual-attenuator-4-ghz-110-db-10-db-steps?nid=-32728.536879121& cc=CA&lc=eng>
9. "Computer Controlled Microwave Tuner, CCMT", Product Note 41, Focus Microwaves Inc. 1998, pages 2-4.
10. Tsironis, U.S. Pat. No. 9,252,471, "Wideband attenuation and phase controller".
11. Verspecht et al. U.S. Pat. No. 7,282,926, "Method and an apparatus for characterizing a high-frequency device-under-test in a large signal impedance tuning environment".
12. Trombone Line Stretchers, ST series, Datasheet, [online] Microlab, [Retrieved on 2017 May 30]. Retrieved from Internet <URL: https://microlabtech.com/st-15n.html>

BACKGROUND OF THE INVENTION

This invention relates to general microwave testing and in particular to testing of differential microwave transistors (DUT) in the frequency and time domain using Load Pull (see ref. 1). Load pull is the method by which the load impedance presented to the DUT at a given frequency is changed systematically using impedance tuners (FIG. 1) and the DUT performance is registered, with the objective to find an optimum depending on the overall design objectives. This may be maximum power, efficiency, linearity or else.

Each port on a connectorized RF device comprises two terminals. When one terminal connection is used to transmit the RF signal and the other is used as a ground reference, the port is referred to as "single-ended". Traditionally, most RF devices have been designed to operate in this mode (FIG. 1). When a terminal is designed to reference a signal on another terminal (and not the ground terminal), it is operating in a "differential" mode (see ref. 3). The terminal pair is known as a differential or "balanced" port, FIG. 2. These circuits are designed to have a pair of electrically symmetrical signal paths. Signals are transmitted through the device 180 degrees out-of-phase with respect to one another. Any signal that is "common" or in-phase to both terminals will ideally be rejected, and will not pass through the circuit. This characteristic gives the device a lower sensitivity to electromagnetic interference (EMI).

A differential load pull setup is shown in FIG. 2. A single ended signal source injects power into a BALUN, see ref. 4. A BALUN (Balanced-Unbalanced) is a component which generates a differential signal from a single ended one or the opposite. It has three terminals; the input terminal relative to a common (ground) terminal creates a single ended input/output port and two terminals create the differential output/input port. BALUNs can be used in both directions. The accuracy of the measurement depends on the precision with which the phase opposition and the amplitude equality of the signals at the differential port. Ideally the two signals must have the same amplitude and a phase difference of 180°. In reality this is never the case. Therefore a real test system shall provide for continuous and fine adjustment of the differential signal components, both in amplitude and phase, both before and after the DUT. In FIG. 2 this is done using a Variable Attenuation and Phase Shifter controllers (21, 22). The differential tuners (23, 24) create true differential impedance presented to the differential DUT (25) at both its input (26) and output (27) terminals. Since the APS has a minimum attenuation this must be compensated by fixed attenuators (28, 29). For this and a number of other test applications this invention discloses automated and programmable wideband attenuation and phase controllers. In case of harmonic power injection and/or generation by the DUT the harmonic balance of phase must be also guaranteed; for this a harmonic amplitude and phase controller (HAPC) is required.

PRIOR ART

Variable attenuators (see ref. 5) and phase shifters (see ref. 6) have been known for a long time. Finely adjustable variable attenuators are known in waveguide transmission structures (see ref. 7); in coaxial microwave structures only step attenuators are known (see ref. 8). Waveguide transmission lines are impractical for frequencies below 3 GHz, because of their size (a WR 340 waveguide—2.2-3.3 GHz, is a rectangular tube 3.56" wide and 1.86" high) and limited frequency bandwidth. Linear, finely adjustable phase shifters (line stretchers) are also known, see ref. 9. The structure proposed in ref. 10 uses absorbing material in line with the line stretcher for attenuation control; this creates unnecessary reflections. The structure proposed in the present invention uses low coupling couplers which, by nature, have better reflection behavior and frequency coverage.

A traditional directional coupler (see ref. 2) comprises an input port, an output port a coupled port and an isolated port.

Such couplers are available only as standalone RF components with fixed coupling factor and electrical length between the input and coupling ports. They cannot be part of an adjustable environment (FIG. 13A). The only way to adjust the electrical length and attenuation is to insert a line stretcher (FIGS. 3A, 3B and 4; see also ref. 12) at the input or the coupled port and a variable attenuator on the coupled port. The wave-probe (see ref. 11) disposes of all that. Its simple structure allows it to be inserted into the slot of the slabline to create an adjustable coupling, and be moved horizontally along the slabline to adjust the phase, see FIGS. 5 and 13B. Wave-probes are made using a folded semi-rigid coaxial cable (2, 3) of which the center conductor (7, 8) is partly exposed (4) forming a magnetic loop, inserted into a slabline (5, 6) and coupled to its center conductor (1).

A harmonic amplitude and phase controller, however, is not known.

BRIEF SUMMARY OF THE INVENTION

The harmonic amplitude (attenuation)/phase controller (HAPC) is shown in principle in FIG. 7: it uses, as transmission media, a section of slabline (75), at least two compact mobile signal couplers (wave-probes) (703, 704), sections of flexible coaxial RF cable (79, 705) and a power (signal) combiner (706), which is fixed (707) on the housing; the total is assembled using at least two mobile carriages (see FIG. 9), sliding on the slabline (75) and the same basic technology as slide screw impedance tuners (see ref. 9). However, instead of the reflective tuning probes (slugs) in ref. 9 the vertical axes hold wave probes (72, 704), (see also FIGS. 5, 9, 13B and ref. 11) of which the isolated port is matched (73) and the coupled port (79) is connected to the signal combiner (706). Both wave-probes can move horizontally (701, 709) and vertically (702, 710) or (Y1, Y2). The signal entering in test port (70) and exiting from the output port of the combiner (706) is extracted (708) from the output port (78). The idle port (77) is terminated with characteristic impedance Zo (76). The phase of the wave-probe (72) is determined by the physical distance (71) from the test port (70).

At this point a clarification is due: In a directional coupler (FIG. 6, or insert in FIG. 10) we call port 1 the input port, port 2 the idle port, port 3 the coupled port and port 4 the isolated port. The signal ratio from port 1 to port 3 is called "coupling" (251) or "coupling factor" and the signal ratio from port 2 to port 3 is called "isolation" (252). Therefore the "isolated" port (283) and "isolation" shall not be confused, even though the coupling between port 1 and port 4 is practically equal to the isolation between ports 2 and 3 as well. Otherwise the, herein non used, term "directivity" signifies the difference (in dB) between coupling and isolation (or linear ratio S31/S32). S31 means signal flow from port 1 to port 3; S32 means signal flow from port 2 to port 3.

The vertical axis (99) in a carriage (908) can insert (Y) the wave-probe (91) to various depths (Y1, Y2), FIG. 12, into the slabline (95) and control this way the coupling between the wave-probe (91) and the center conductor (92) and thus the amount of energy flowing from the input port (90) into the wave-probes (91, 903) and from there, through the permanently anchored (97) signal combiner (907), which is connected with the wave-probes using flexible RF cables (904, 906), to the output port (96). The carriages can move (X1, X2) the wave-probes along the slabline (95) thus changing the electrical distance (phase Φ31(X)) between each of the wave-probes and the input port (90). This controls the transmission phase between the input and output ports on each path (904, 906) independently. By consequence simple X-Y (horizontal-vertical) movement of the carriages and vertical axes control is translated into an attenuation/phase control of two parallel wideband signal transmissions, which are then combined at the output of the signal combiner (907) creating a synthesized signal, which can be processed to control harmonic transmission factors S31(Fo) and S31(2Fo) independently.

DETAILED DESCRIPTION OF THE DRAWINGS

The invention will be better understood in view of the included drawings of which FIG. 1 depicts prior art, a typical single ended load pull test system.

FIG. 2 depicts prior art, a typical differential load pull test system.

FIG. 3A through 3D depict prior art, structural and schematic diagrams of linear phase shifter (3A and 3B) and variable attenuator (3C); FIG. 3A depicts a tubular coaxial line stretcher; FIG. 3B a cross section of the linear line stretcher; FIG. 3C a T-form variable attenuator and associated electrical symbol, and FIG. 3D the symbol of a combined variable attenuator and phase shifter.

FIG. 4A through 4B depict prior art, the structural detail of the coaxial and slabline transition in a linear phase shifter; FIG. 4A depicts a cross section and FIG. 4B depicts a top view of the phase shifter, once one cover plate is removed.

FIG. 5 depicts prior art, the perspective 3D view of a "wave-probe" type signal coupler.

FIG. 6 depicts prior art, signal flow definitions in a bidirectional signal coupler.

FIG. 13A depicts the commercial coupler and FIG. 13B depicts the stand-alone wave-probe.

DETAILED DESCRIPTION OF THE INVENTION

Figure 10:
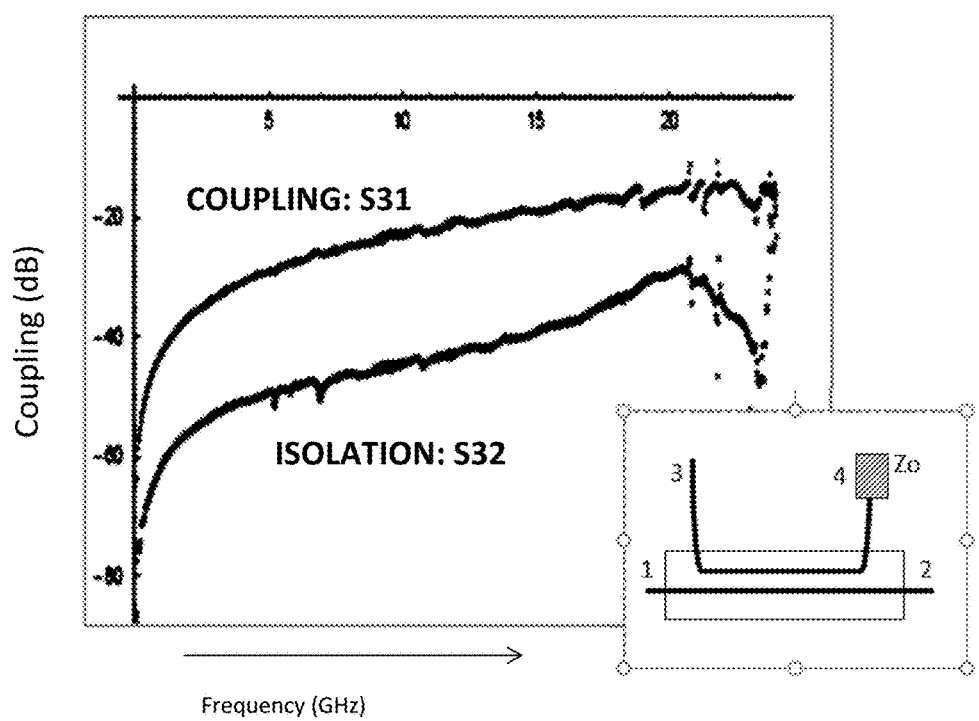
FIG. 10 depicts port definitions and measured wideband response of coupling and isolation of wave-probe used in HAPC.
Figure 13A:
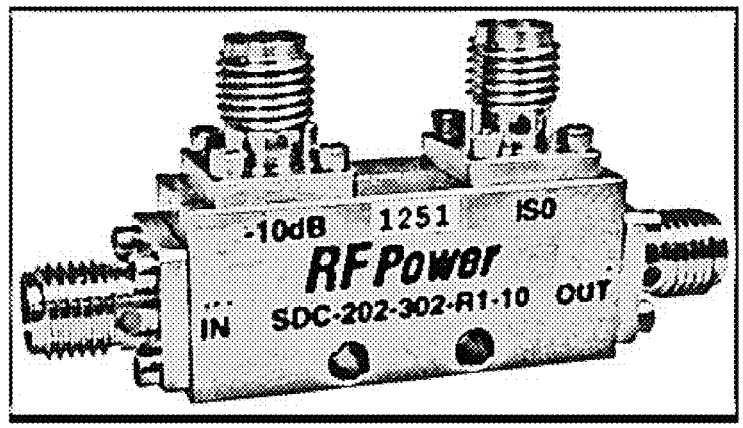
FIG. 13A through 13B depict prior art: the difference between a commercially available (fixed) directional coupler and an adjustable wave-probe.
Figure 13B:
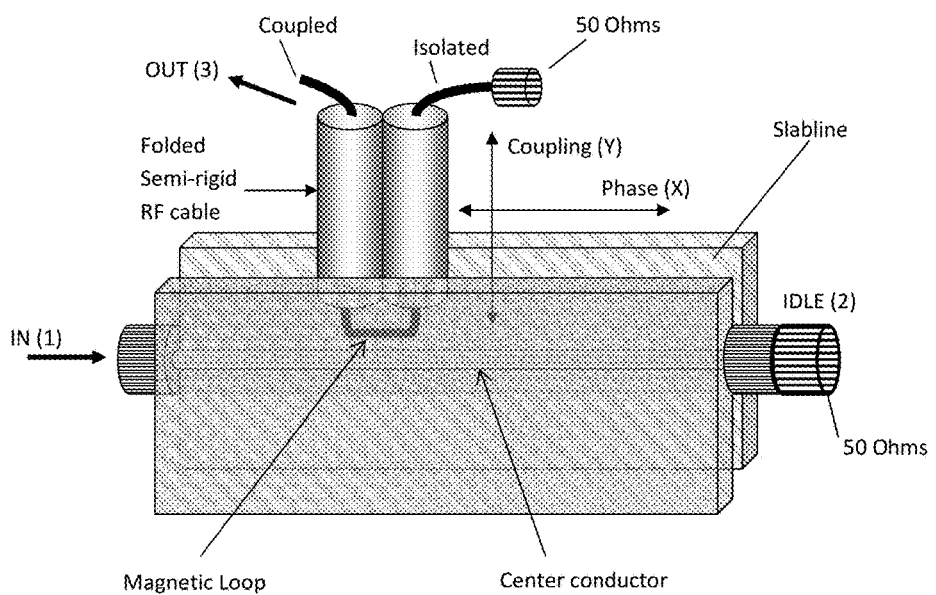

The herein disclosed harmonic amplitude and phase controller uses the capability of the wideband (FIG. 10) and easily adjustable (FIG. 11) properties of the compact signal coupler hereby called "wave-probe" (see ref. 11 and FIGS. 5 and 13B). The compactness and easy manufacturing of this device, combined with the simple handling and positioning inside the slabline, allows combining this technology with the existing slide screw impedance tuner hardware and tuning software technology (see ref. 9) in creating a new component, the Harmonic Attenuation-Phase Controller (HAPC) allowing efficient control of attenuation and phase of a transmission media at fundamental and harmonic frequencies. All existing control technology of the tuners (ref. 9) is implemented into this new design, including motor gear and control, precise horizontal and vertical axis control and computer controlled remote operation. The inherently large bandwidth and simple coupling adjustability of the wave-probe (see FIGS. 10 and 11) solves critical bandwidth and spurious problems of prior designs (see ref. 10).

The wave-probe (FIGS. 5 and 13B) is a basic electromagnetic loop, made as the folded exposed section of part of the center conductor of a semi-rigid RF coaxial cable. It has wideband coupling and isolation behavior (FIG. 10) sufficient for this application. The difference between coupled and rejected (isolated) signal is called Directivity and varies between 10 and 20 dB. By approaching the magnetic loop to the center conductor of the slabline, one increases the coupling factor (see FIG. 11). The wideband frequency response remains intact. This is a major advantage because it offers predictable response at the fundamental and the harmonic frequencies.

Figure 9:
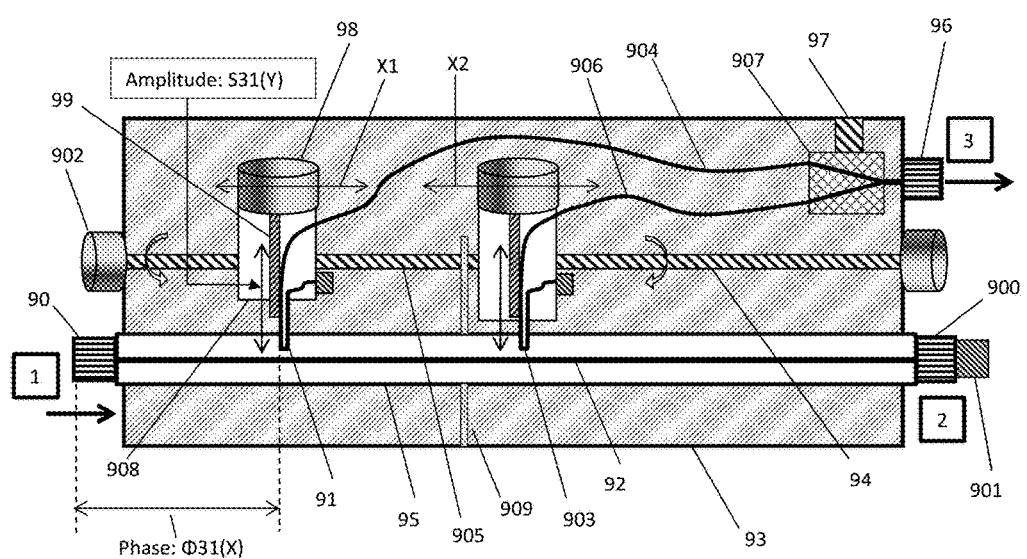
FIG. 9 depicts detailed structure of automated harmonic attenuation and phase controller (HAPC).

In more detail the HAPC is shown in FIG. 9. By moving the wave-probe loops (91, 903) closer or further away from the input port (90) changes the transmission phase of the signal path from the input port (90), through the wave-probe couplers (91, 903) to the signal combiner (907) and thus to the output port (96). Because of the horizontal wave-probe loop movement (91, 903) the RF cables (904, 906) must be flexible and must allow full expansion and contraction. The output port of the slabline (900) is terminated with the characteristic impedance (901), in order to eliminate reflected waves towards the input port, which would interfere with the signal coupled into the wave-probes.

Figure 12:
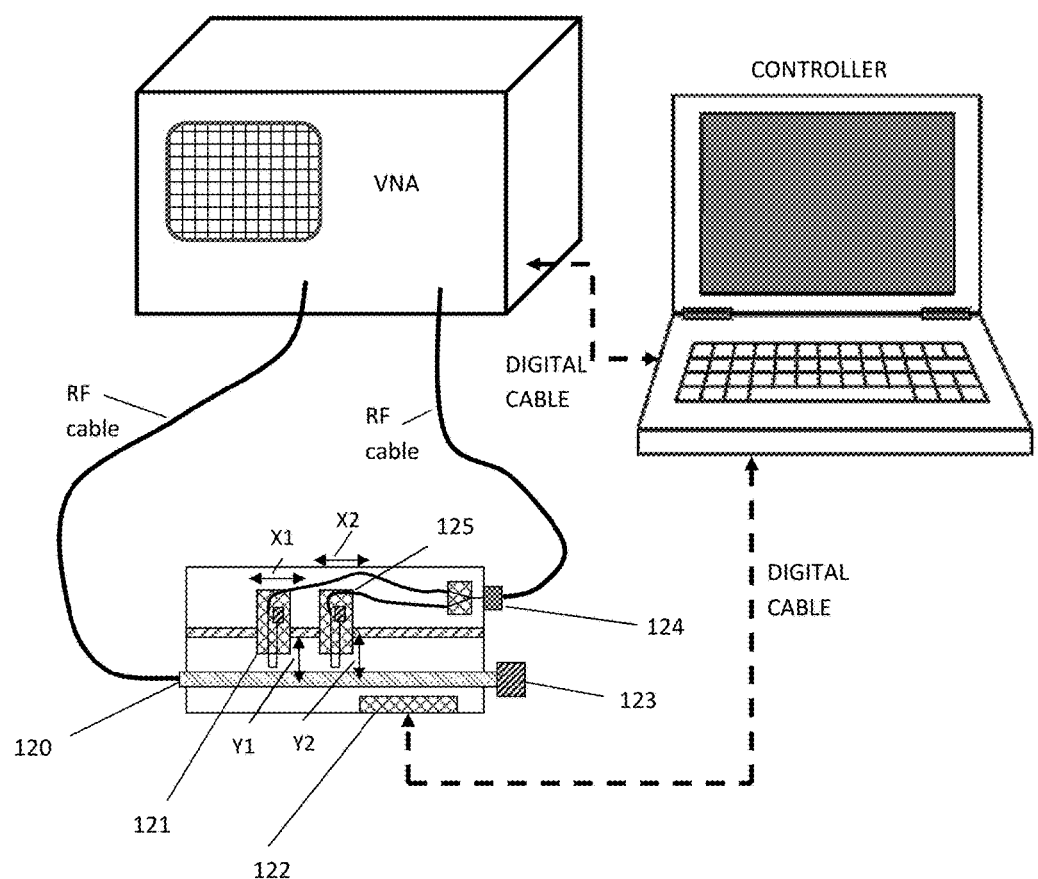
FIG. 12 depicts calibration test setup for HAPC using PC controller and vector network analyzer (VNA).

The unit is mounted in a housing (93) in which the slabline (95) traverses from the input port (90) to the auxiliary port (900), which in fact is the output port of the slabline itself, but is not used in this apparatus. The auxiliary port is terminated using a matched load (901). The lead screws (94, 905) control, using horizontal stepper motors (902), the horizontal positions of the carriages (908) independently. The lead screws are rotated by stepper motors (902). Each carriage (908) comprises precision vertical axis (99), which is controlled by vertical stepper motor (98). Carriage (121, 125) positions (X1, X2) and vertical axis positions (Y1, Y2) are controlled via stepper motors, which are controlled via electronic control board (122) and external PC, and s-parameters are measured using the VNA between ports (120) and (124) as shown in FIG. 12, whereby port (123) is terminated with Zo. The support wall (909) in FIG. 9 allows the two lead screws (905) and (94) to rotate independently and move the two carriages independently.

Figure 11:
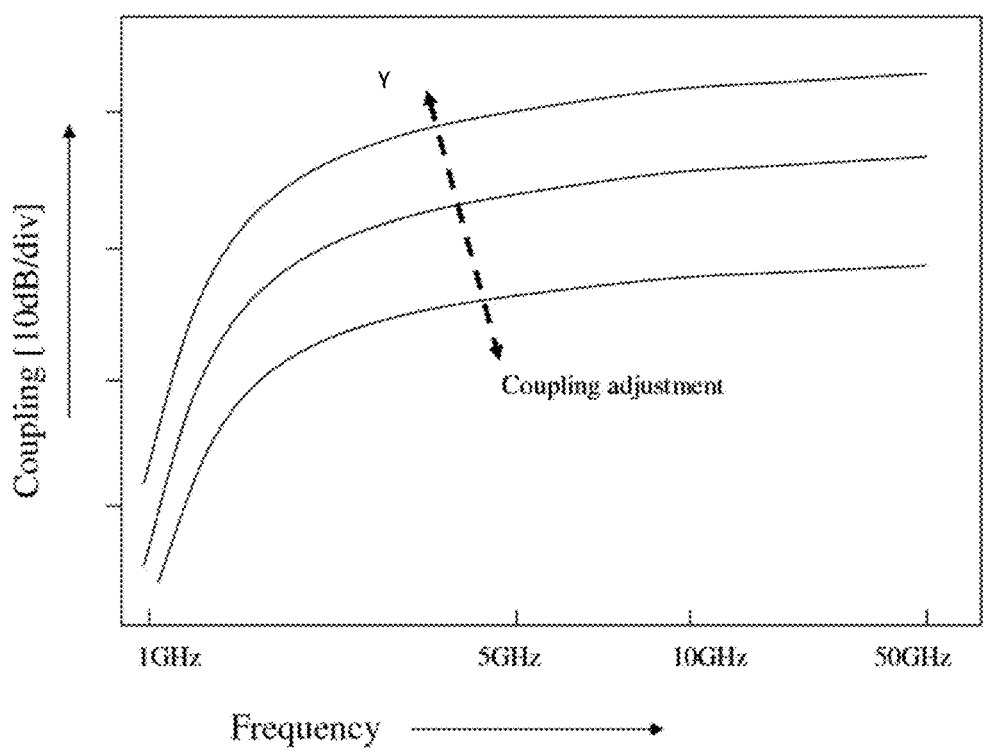
FIG. 11 depicts coupling control of wave-probe via depth control (Y) of the probe into the slabline.

The vertical axis (99) holds the body of the wave-probe (91). It can move the wave-probe vertically closer of further away from the center conductor (92). Changing the distance to the center conductor changes the coupling factor (as shown in FIG. 11). This means the amount of signal power transferred from the input port (90) to the output port (96) can be adjusted. This corresponds to the adjustable attenuation. The coupled port of the wave-probes is connected to the signal combiner (907) which is fixed (97) on the housing (93), using flexible coaxial RF cables (904, 906) and then leads to the output port (96). The cables must allow the carriages to move along enough distance on the slabline to cover the required angle of the transmission phase. For a full circle of the S31 vector ($\Phi 31$ max$-\Phi 31$ min=360° this distance must be one wavelength $\lambda$ for each coupler, i.e. a total length of the slabline of two wavelengths ($2\lambda$) is required. The wavelength $\lambda$ in air is equal: $\lambda$ [cm]=30/Frequency [GHz]. i.e. for 1 GHz this is 30 cm horizontal travel and for 10 GHz this is 3 cm. The transmission phase is linearly proportional to the distance (X) of each wave-probe from the input port: $\Phi 31$ (rad)=$2*\pi*X/\lambda$. The change in phase $\delta\Phi 31=2*\pi*\delta X/\lambda$, can be accurately controlled by horizontal movement of the carriage. The phase of the section between wave-probe and output port remains constant.

The HAPC can be calibrated and used in automated test setups in order to control the instant phase of the transmission factor between ports (90) and (96) at each harmonic frequency independently. To be able to set the HAPC in a state for doing so, it has to be calibrated beforehand. Calibration is performed by measuring s-parameters at the selected fundamental and harmonic frequencies using a pre-calibrated vector network analyzer (VNA). The VNA measures amplitude and phase of reflection factors in a 50 Ohm nominal environment at the input and output ports and transmission factors between them. In this, first embodiment (FIG. 9) the HAPC being a passive reciprocal network, the parameters S31 and S13 are equal (S31=S13). The fact that at least two wave-probes are present in the slabline section, however, complicates matters. Generating s-parameters for all possible permutations of amplitude and phase of the transmission factor of each probe is an extremely long process. Assuming each wave-probe is set to 100 horizontal and 20 vertical (coupling) states, then each wave-probe must be characterized at 2,000 settings. If a second wave-probe must be also characterized at 2,000 settings, then the required permutations are 4,000,000. Assuming one measurement and setting takes 1 second; this would require approximately 46 days.

There must be another method if the apparatus were to be of any practical use; and there is. It is called "de-embedded calibration" and consists in measuring each coupler separately, while all other couplers are withdrawn from the slabline and de-embed all but one coupler, usually the one closest to the input port, with the initialized matrix of the HAPC. The de-embedding algorithm allows the same task performed in only 2×2000=4,000 seconds (approximately 1 hour), by measuring only the sum of the settings and not the product. To do so the s-parameters of the HAPC transmission media from input to output port must be measured with both wave-probes withdrawn from the slabline and saved as a INIT matrix [S00] for all selected frequencies. Subsequently the invers matrix $[S00]^{-1}$ must be cascaded with the s-parameters of the second (and any subsequent) wave-probe s-parameter matrix and saved; then the actual permutations of the cascade of all s-parameter matrices of all wave-probes are generated in computer memory for all selected frequencies, a task that takes only seconds. This way the effect of the initialized body of the transmission media of the HAPC is extracted from the raw s-parameter measurement of all wave-probes, except for the first one; otherwise the cascade would comprise the parameters of the HAPC body twice, three times etc. (the number of wave-probes). In terms of calibration of the two-port between the input port and the output port, all possible setting permutations must be characterized. If three wave-probes are used to control a third harmonic frequency then the duration of the non-de-embedded calibration would become 2000×46 days, or 254 years, whereas using the de-embedding method this only lasts 1.5 hours (3×2000 seconds).

The procedure executes as follows: in a first step all couplers (wave-probes) are withdrawn from the slabline (Coupling=0) and s-parameters are measured on a pre-calibrated VNA between in- and output ports and the result is saved in a matrix [S00] for each harmonic frequency. Then, in a second step, each coupler individually is moved to a number of phase (X) and coupling (Y) settings as described above, and s-parameters are measured and saved. In a third step all s-parameters of all couplers, except of coupler 1, are cascaded with the invers initialized matrix: $[S00]^{-1}$: Cascading s-parameters is not directly possible, they must be converted to [ABCD] or T-parameters: [S]→[T]; then the relations are: [T1(Xi,Yj)]=[T1.m(Xi,Yj)] and $[Tk(Xi,Yj)]=[T00]^{-1}*[Tk.m(Xi,Yj)]$ for k>1; whereby "k" is the index of the coupler and index "m" indicates the measured values. Subsequently all permutations of all coupler settings can be calculated in memory in short time.

Once the HAPC is calibrated at a certain number of settings the data can be used for attenuation and phase adjustments. However the typical 600 or up to 1000 settings per frequency may not be sufficient, in particular for simultaneous and independent fine adjustment. Typically a few millions of possible setting permutations are needed. These can only be created using interpolation between calibration points. As can be seen in FIG. 11 the coupling factor can be adjusted continuously using the wave-probe penetration (Y), when displayed in logarithmic scale [dB]: Coupling: C[dB]= A*Y/Ymax, whereby Y=0 designates full wave-probe withdrawal (C=-∞ dB) and Y=Ymax designates the wave-probe quasi touching the center conductor (C=0 dB); and A is a constant empirical calibration factor. The phase adjustment is simple, the phase is proportional to the frequency and linear distance (X) from the input port: Φ=-2π*X/λ, whereby λ is the wavelength: λ[cm]=300/Freq[GHz]. Then interpolation can use a linear algorithm between calibration points $(X_i, Y_j)$ as follows: Horizontal (Phase): $[S(X,Y_j)]=(X-X_i)/(X_{i+1}-X_i)*([S(X_{i+1},Y_j)]-[S(X_i,Y_j)])$ and, using the result of the first relation: Horizontal (phase) and Vertical (Coupling, dB): $[S(X,Y)]=(Y-Y_j)/(Y_{j+1}-Y_j)*([S((X,Y_{j+1})]-[S(X,Y_j)])$. The interpolation algorithm is applied to each de-embedded coupler separately and for each frequency, before the matrices are cascaded in computer memory.

When a specific attenuation and phase of the transmission factor S31=Real(S31)+j*Imag(S31) or S31=|S31|*exp(jΦ31) needs to be generated by the HAPC, this can only be done numerically using appropriate searching through the {S31(Xi, Yj)} calibrated and interpolated transmission factor space. In case the load impedance is not 50Ω ($\Gamma_{load}$≠0) and the reflection factor into the output port S22≠0, the transmission factor b2/a1=S21/(1−S22*$\Gamma_{load}$) must be considered instead of simply S31; whereby b2 is the outgoing power wave and a1 the incident one. As already stated the calibrated settings may be insufficient to satisfy the target specifications for all frequencies simultaneously. In that case interpolated values are needed, calculated as shown above. The search works best in two steps. In a first step the search yields settings (Xo.i,Yo.j) corresponding to S31 values closest to the target S31.T at the fundamental frequency S31.T (Fo). Then, in a second step, a search is executed for calibrated and interpolated values close to (Xo.i,Yo.j), alternatively in Xi and Yj direction of all wave-probes, using an Error Function comprising all harmonic frequencies N*Fo: EF=ΣW(F)*|S31(Xi,Yj, F)−S31.T (F)|; EF is the weighed sum of all S31; hereby W(F) is a user selected weighing factor as a function of frequency. W(F) typically varies between 0 and 5, whereby when set to 0 this signifies that the corresponding frequency is considered irrelevant and when selected to 5 this means that this frequency is very important.

Figure 7:
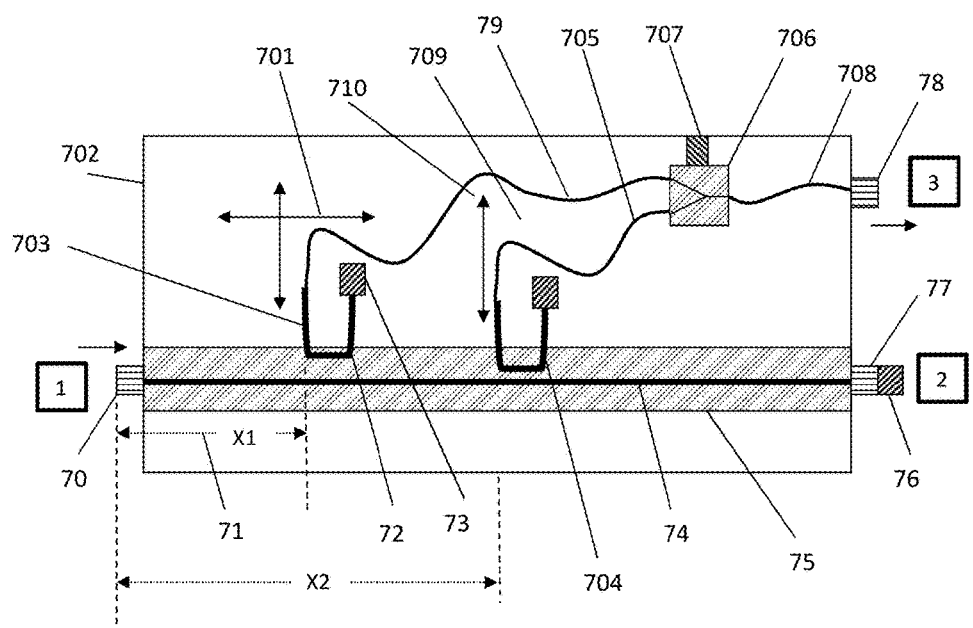
FIG. 7 depicts the basic structure of the adjustable harmonic attenuation and phase controller (HAPC).
Figure 8:
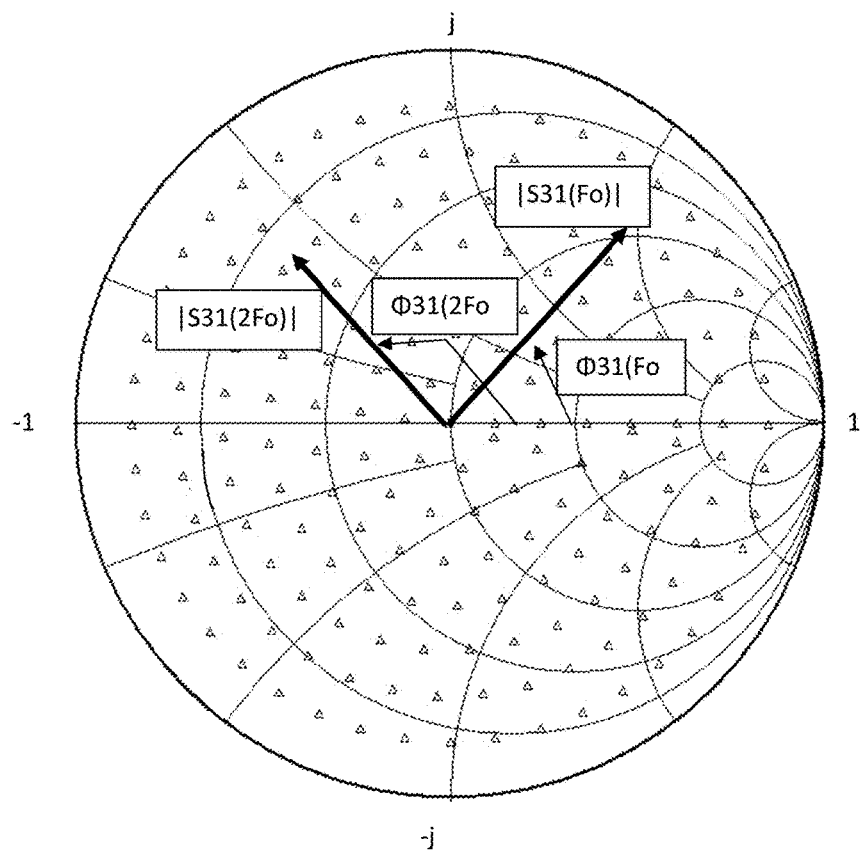
FIG. 8 depicts measured transmission factor vectors of the HAPC as a function of coupling factor and phase at the fundamental (Fo) and one (2Fo) harmonic frequency.

If the HAPC s-parameters are used in a complete test setup as in FIG. 2, then additional calibration steps must be carried out to characterize the adjacent components used in cascade with the HAPC, such as test fixtures and bias tees. FIG. 8 shows measured transmission vector data of an HAPC. Every point |S31(NFo)| and Φ31(NFo) on the polar display corresponds, at each selected harmonic frequency, to a horizontal and vertical setting of the wave-probes. Hereby the input port is designated as port 1 and the output port as port 3. The data are saved in a calibration file and by proper motor control the states can be reactivated and every point in between can be interpolated within the resolution of the driving gear and stepper motors, using the previously disclosed relations.

It is important to recognize that HAPC with two wave-probes can control independently transmission factors at any two frequencies, such as Fo and 2Fo, or Fo and 3Fo etc. and HAPC with three (or more) wave-probes can control such values at three (or more) combinations of frequencies, all using the same calibration and synthesis algorithms but with different measured data.

Figure 14:
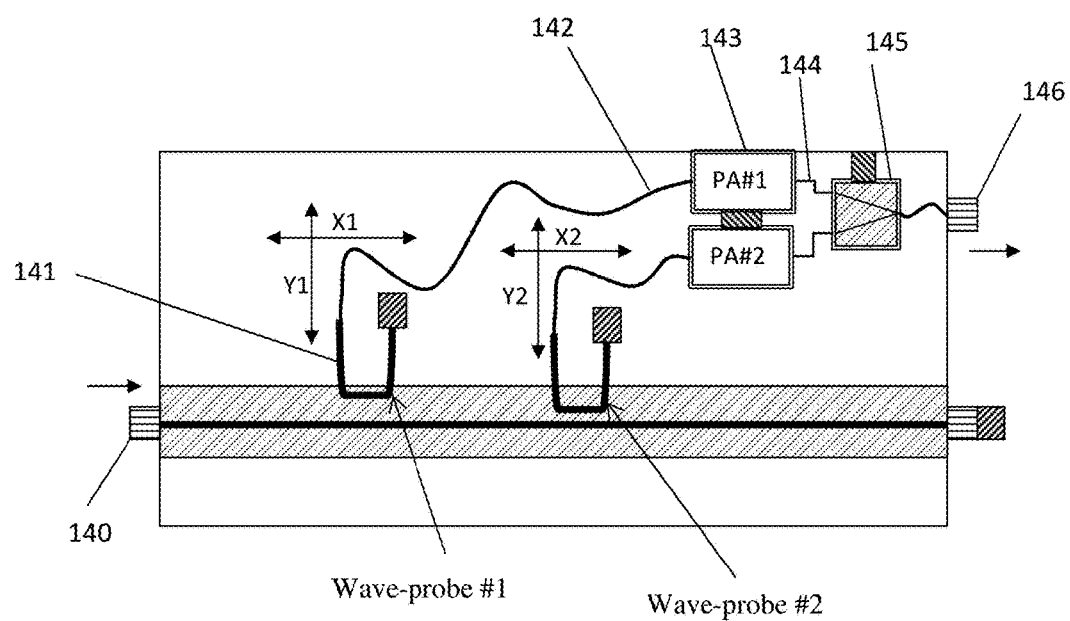
FIG. 14 depicts a harmonic amplitude and phase controller with embedded power amplifiers (PA#1 and PA#2) compensating for coupling loss.

The coupling factor is small (FIG. 10); it varies between −30 and −20 dB. Stronger coupling can increase this value to −10 dB. If this is insufficient for the signal transmission purpose from port (140) to port (146) of a specific application, in a second embodiment, power amplifiers (143) can be inserted into the coupled paths (142) (PA#1 and PA#2), and then combined (144) into the signal combiner (145), FIG. 14. As long as the power amplifiers are operated in their linear regime, the calibration and tuning algorithms disclosed above can be used. If the signal power injected into the amplifiers (at higher coupling) drives the amplifiers in nonlinear regime, then the calibration becomes unreliable, because for various coupling factors the transmission behaviour S31, which includes the Gain and transmission phase of the amplifiers, may change. Also the amplifiers must cover all harmonic frequencies to be transmitted. This makes calibration more difficult and adds an additional parameter, which is the power injected into port (140). If the powers at which the apparatus will be used are known ahead of time, a set of input powers can be added into the calibration procedure and interpolated in a multi-dimensional procedure, as a function of probe settings with acceptable accuracy.

This application discloses the concept of an automated, harmonic, wideband variable attenuator and linear phase shifter for microwave frequencies and calibration algorithm and method for independent harmonic transmission control. Obvious alternatives shall not impede on the originality of the concept.

What I claim is:

1. An adjustable harmonic RF attenuation and transmission phase controller (HAPC) having an input and an output port and transmission media between the ports;

whereby the transmission media comprises a cascade of slotted airline (slabline), at least two adjustable signal couplers (wave-probes #1, #2, . . . ) mounted on the slabline, a multi-port signal combiner having at least two input ports and one output combination port, and flexible RF cables;

and whereby the signal, comprising fundamental and harmonic components, enters the input port, traverses part of the slabline and is coupled into each wave-probe;

and whereby the signal coupled into each wave-probe is injected into an associated input port of the signal combiner and the combined signal exiting from the combination port of the signal combiner is extracted from the output port;

whereby the coupling factors between the wave-probes and the transmission airline control the amplitude and the physical distances of the wave-probes from the input port control the phase of the transmission factor of the HAPC between input and output ports at the fundamental and harmonic frequencies.

2. A HAPC as in claim 1, whereby the slotted airline (slabline) comprises two ports, two sidewalls and a center conductor;

and whereby one port of the slabline serves as the input port of the HAPC, and the other port of the slabline is terminated with characteristic impedance (Zo).

3. A HAPC, as in claim 2 having at least two mobile carriages sliding independently horizontally along the slabline, each said carriage having a vertical axis.

4. A HAPC as in claim 3, whereby the wave-probes are attached to the vertical axis of the associated carriages, move horizontally with the carriages and can be inserted independently into the slot of the slabline.

5. A HAPC as in claim 4, whereby the vertical axes are remotely controlled allowing independent adjustment of the coupling factors between the center conductor of the slabline and the wave-probes.

6. A HAPC as in claim 5, whereby the carriages are remotely controlled.

7. A HAPC as in claim 2, whereby the coupled ports of the signal couplers are connected to the input ports of the signal combiner using flexible RF cables and whereby the output port of the signal combiner is connected to the output port of the HAPC and whereby the isolated ports of the couplers are terminated with characteristic impedance (Zo).

8. A HAPC as in claim 2 or 7, whereby Zo is 50 Ohms.

9. A calibration method for HAPC as in claim 8, wherein the HAPC is connected to a pre-calibrated vector network analyzer (VNA) using RF cables and to a control computer using digital cables;

and scattering (s−) parameters are measured by the VNA between the input port and the output port of the HAPC at the fundamental frequency (Fo) and at least one harmonic frequency (N*Fo), for various settings of the coupling factors and the distances between the couplers and the input port, the settings being controlled by the computer, which is in operative communication with the VNA, whereby N=2, 3 . . . , in following steps:

a) all wave-probes are initialized (withdrawn from slabline) and s-parameters of the HAPC are measured and saved in a matrix [S00];

b) wave-probe #1 is inserted into the slabline in a number of steps Y1.j and for each Y1.j it is moved horizontally in a number of steps X1.i;

c) s-parameters [S1(X1.i,Y1.j)] are measured between the input and output ports and saved;

d) wave-probe #1 is initialized and step b) is applied to wave-probe #2 resulting in a matrix [S2(X2.i,Y2.j)];

e) steps c) and d) are applied to all other wave-probes, whereby all wave-probes remain initialized except for the wave-probe being controlled and measured;

f) s-parameters of all wave-probes, except wave-probe #1, are de-embedded (cascaded with $[S00]^{-1}$);

g) permutations of all s-parameter matrices are created in computer memory and saved in calibration files for all selected frequencies for later use.

10. A tuning (transmission factor synthesis) method for HAPC between input port (1) and output port (3), uses calibration data generated in claim 9 as follows:

h) s-parameters are loaded in memory for selected frequencies F=Fo, 2Fo, . . . NFo;

i) error function EF is generated comprising the sum of vector differences between target transmission factor S31.T(F) and calibrated transmission factor S31.C(F) for all selected frequencies F=Fo, 2Fo, . . . NFo;

j) a search algorithm through the s-parameter space selects the carriage positions X1, X2, . . . XN and vertical axis positions Y1, Y2, . . . YN corresponding to minimum error function EF in step b);

k) carriages and vertical axes are positioned as in step c).

11. Interpolated transmission factors S31(F).I at each frequency (F) are used in claim 10, instead of calibrated ones.

* * * * *